United States Patent
Katsuki

(10) Patent No.: US 10,971,414 B2
(45) Date of Patent: Apr. 6, 2021

(54) SEMICONDUCTOR DEVICE

(71) Applicant: FUJI ELECTRIC CO., LTD., Kawasaki (JP)

(72) Inventor: Takashi Katsuki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/777,819

(22) Filed: Jan. 30, 2020

(65) Prior Publication Data

US 2020/0294874 A1 Sep. 17, 2020

(30) Foreign Application Priority Data

Mar. 11, 2019 (JP) .............................. JP2019-043891

(51) Int. Cl.
*H01L 23/12* (2006.01)
*H01L 23/053* (2006.01)
*H01L 23/31* (2006.01)
*H01L 23/29* (2006.01)
*H01L 23/10* (2006.01)

(52) U.S. Cl.
CPC ............ *H01L 23/053* (2013.01); *H01L 23/10* (2013.01); *H01L 23/293* (2013.01); *H01L 23/3142* (2013.01)

(58) Field of Classification Search
CPC ..... H01L 23/053; H01L 23/10; H01L 23/293; H01L 23/3142
USPC ........................................................ 257/701
See application file for complete search history.

(56) References Cited

U.S. PATENT DOCUMENTS 6,421,244 B1 * 7/2002 Shinohara ............... H01L 23/24
257/E23.14
6,844,621 B2 * 1/2005 Morozumi .......... H01L 23/3735
257/700

FOREIGN PATENT DOCUMENTS

| JP | 2004134624 A | 4/2004 |
|---|---|---|
| JP | 2008251793 A | 10/2008 |
| JP | 2009064806 A | 3/2009 |
| JP | 2011014739 A | 1/2011 |
| JP | 2013165125 A | 8/2013 |
| WO | 2015152373 A1 | 10/2015 |

* cited by examiner

*Primary Examiner* — Luan C Thai
(74) *Attorney, Agent, or Firm* — Rabin & Berdo, P.C.

(57) ABSTRACT

A case includes a terminal disposition portion which includes a disposition surface projecting from an inner wall surface toward an open area, exposes an exposure region on a front surface of an external connecting terminal, and embeds therein a rear surface of the external connecting terminal. In the case, at at least part of both sides along a pair of opposite sides of the exposure region, the disposition surface is located between the front surface and the rear surface to have a level difference to the front surface. In a semiconductor device with the above-described configuration, the case does not extend to the exposure region on the front surface of the external connecting terminal. Therefore, no encapsulation resin flows into an interfacial debonding gap between the external connecting terminal and the case, thus curbing further advance of the interfacial debonding.

10 Claims, 12 Drawing Sheets

SEMICONDUCTOR DEVICE

CROSS-REFERENCE TO RELATED APPLICATION

This application is based upon and claims the benefit of priority of the prior Japanese Patent Application No. 2019-043891, filed on Mar. 11, 2019, the entire contents of which are incorporated herein by reference.

BACKGROUND OF THE INVENTION

1. Field of the Invention

The embodiment discussed herein is related to a semiconductor device.

2. Background of the Related Art

Semiconductor devices include a plurality of power semiconductor chips and are used, for example, as power converters for inverter devices. Examples of power semiconductor chips include the power MOSFET (metal oxide semiconductor field effect transistor), IGBT (insulated gate bipolar transistor), and FWD (freewheeling diode). In addition, the RC-IGBT (reverse conducting IGBT) configured by integrating an IGBT and an FWD, and the RB-IGBT (reverse blocking IGBT) having sufficient resistance even to reverse bias voltage are also examples of power semiconductor chips.

Such a semiconductor device used in power supplies includes a ceramic circuit board onto which semiconductor chips are soldered and external connecting terminals, such as a lead frame, electrically connected to the semiconductor chips. The semiconductor device further includes a case for housing the semiconductor chips and the ceramic circuit board. The external connecting terminals are insert molded into the case such that one ends of the external connecting terminals are located inside the case and the other ends extend outside the case. As for the external connecting terminals insert molded into the case in this manner, portions to be electrically connected to the semiconductor chips are exposed from the case and the remaining portions are embedded in the case.

Japanese Laid-open Patent Publication No. 2011-014739
Japanese Laid-open Patent Publication No. 2004-134624

However, for the external connecting terminals thus insert molded into the case, there remains a problem that interfacial debonding between the case and the external connecting terminals may occur depending on materials used for the case and the external connecting terminals. In the case where interfacial debonding takes place, repeated thermal cycles in the semiconductor device lead to further debonding at the interface between the case and the external connecting terminals. When the extent of debonding becomes large, it is difficult to maintain mutual insulation of circuit elements inside the semiconductor device. In addition, water enters inside the semiconductor device from outside through the interfacial debonding, causing, for example, corrosion of internal parts. As a result, properties of the semiconductor device are degraded, which in turn reduces reliability of the semiconductor device.

SUMMARY

According to an aspect, there is provided a semiconductor device including a semiconductor chip, an external connecting terminal having a flat plate shape, the external connecting terminal including a front surface having an exposure region and being electrically connected to the semiconductor chip, and a rear surface opposite to the front surface, a case including a frame portion and a terminal disposition portion, the frame portion having an inner wall surface surrounding an open area in which the semiconductor chip is disposed, the terminal disposition portion projecting from the inner wall surface toward the open area and having a disposition surface thereof, the external connecting terminal penetrating through the frame portion from an outside of the case toward the inner space, a rear surface side of the external connecting terminal being embedded in the terminal disposition portion from the disposition surface thereof, the exposure region of the front surface of the external connecting terminal being exposed from the disposition surface of the terminal disposition portion, and a sealing member fixedly encapsulate the semiconductor chip in the open area. The exposure region of the external connecting terminal has a pair of opposite sides parallel to each other in a direction from the inner wall surface toward the inner space, and at an area facing at least part of the opposite sides of the exposure region, the disposition surface is located between the front surface and the rear surface of the external connecting terminal in a thickness direction thereof, to have a level difference to the front surface of the external connecting terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
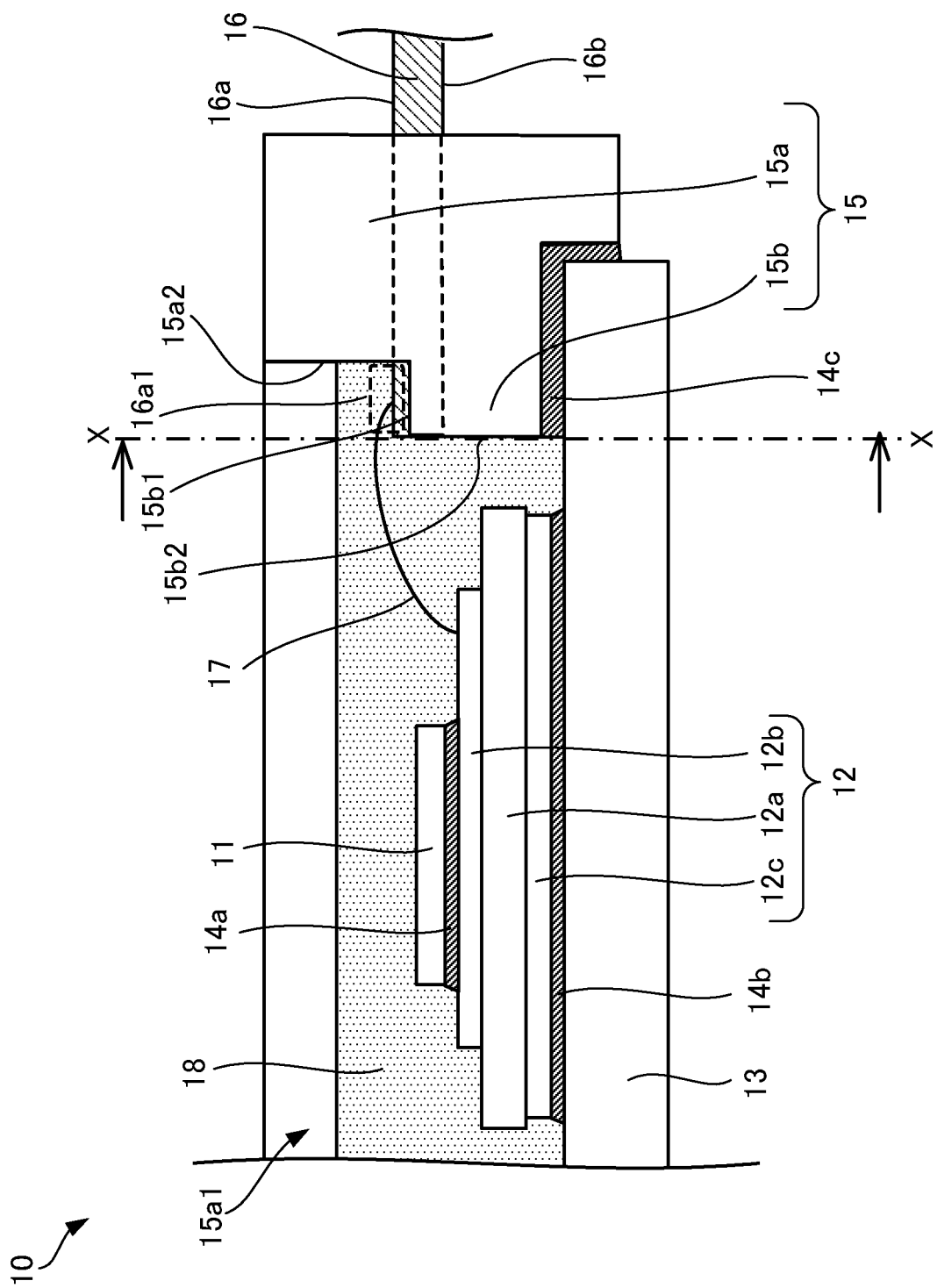
FIG. 1 is a cross-sectional view depicting relevant parts of a semiconductor device according to a preferred embodiment.
Figure 2:
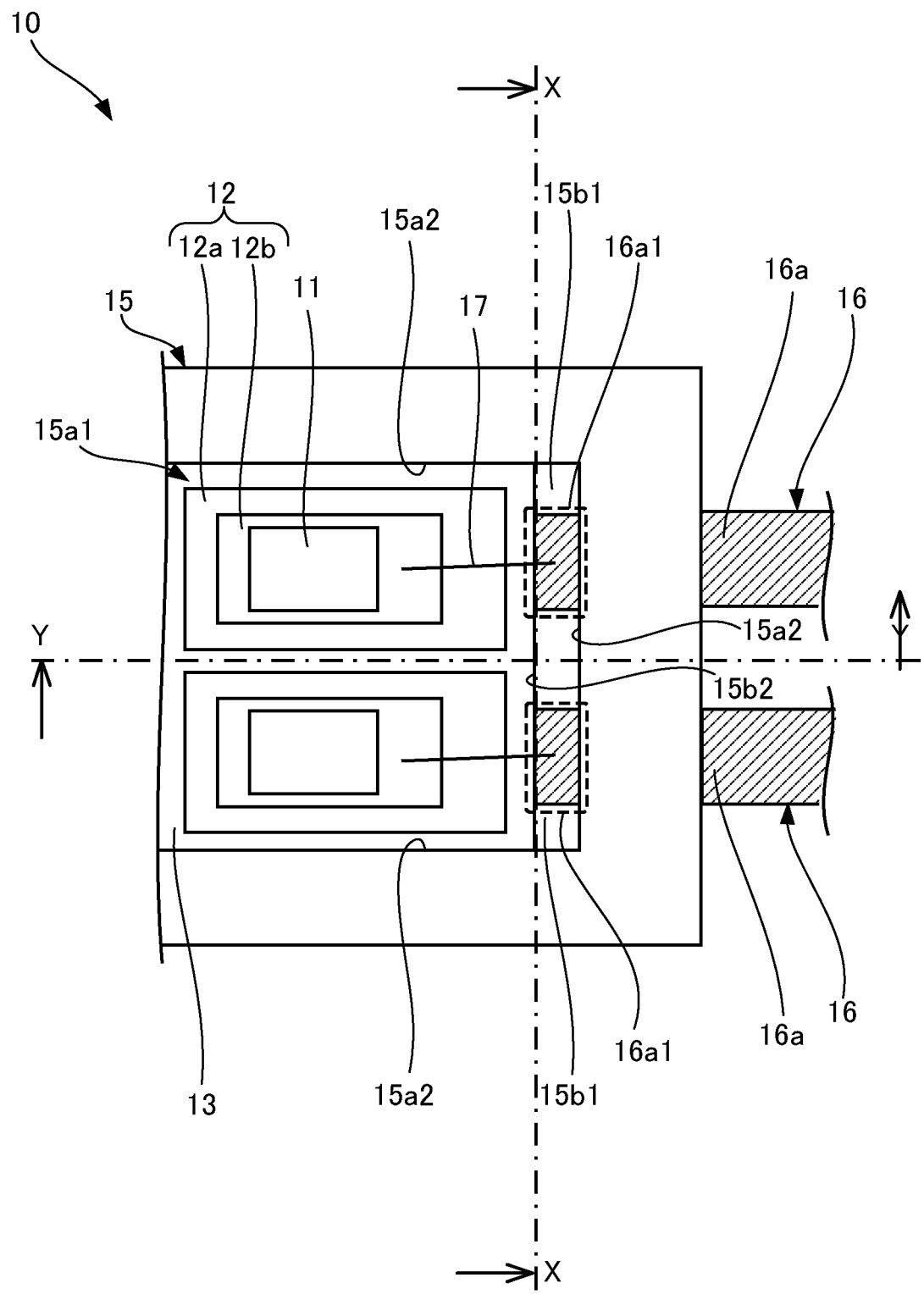
FIG. 2 is a plan view depicting relevant parts of the semiconductor device according to the preferred embodiment.
Figure 3:
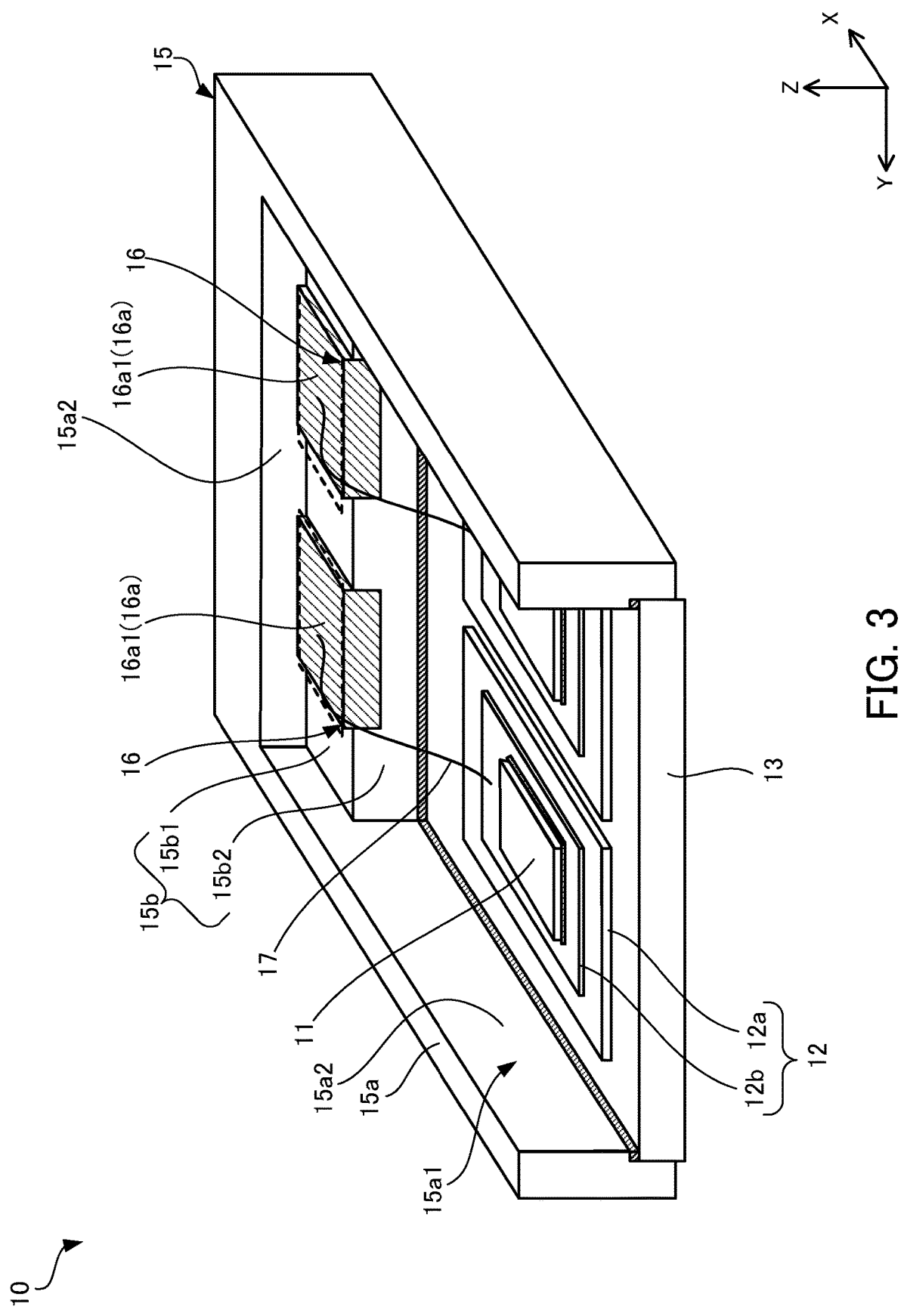
FIG. 3 is a perspective view depicting relevant parts of the semiconductor device according to the preferred embodiment.
Figure 4:
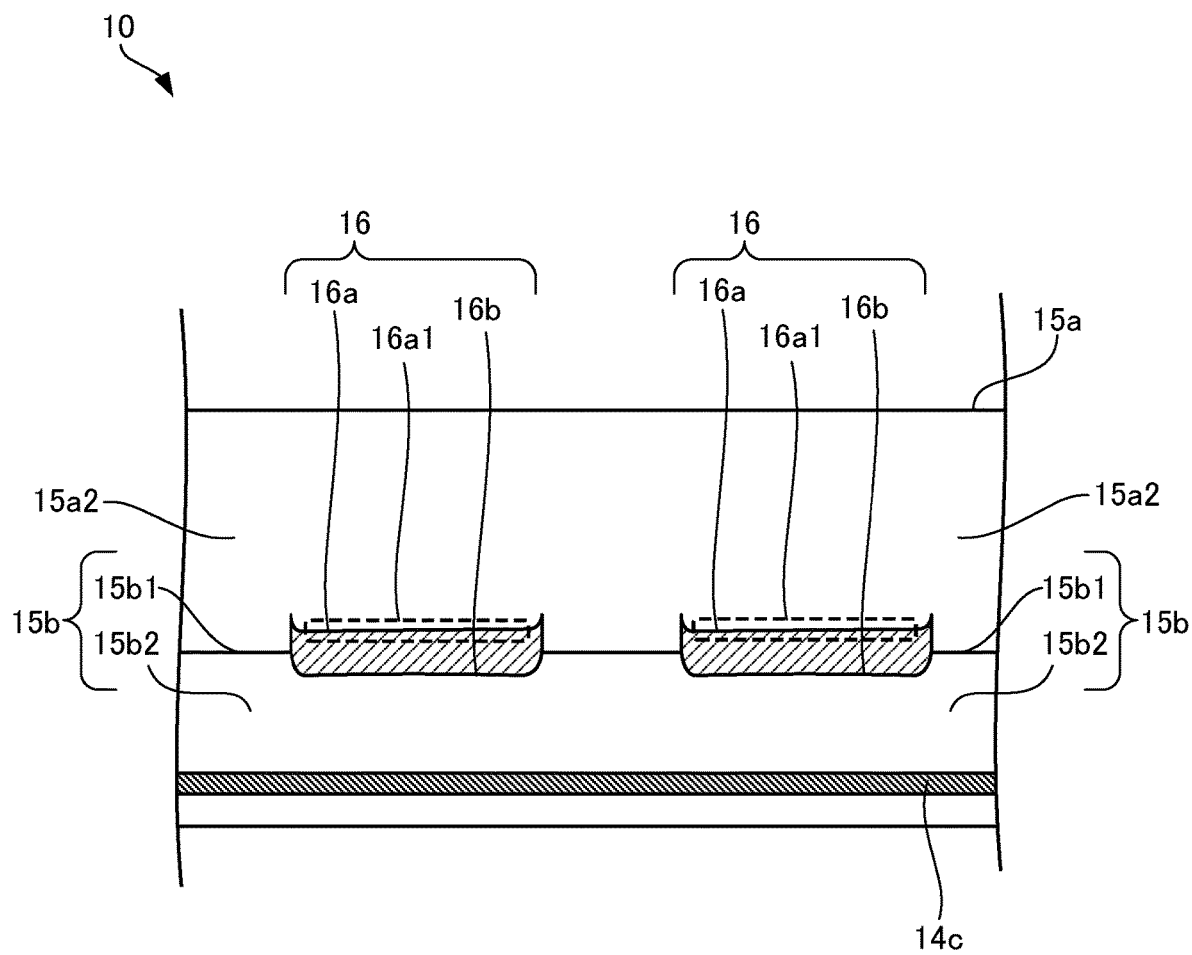
FIG. 4 is an enlarged view depicting relevant parts of external connecting terminals of the semiconductor device according to the preferred embodiment.

Next described is a semiconductor device according to a preferred embodiment, with reference to FIGS. 1 to 4. FIG. 1 is a cross-sectional view depicting relevant parts of the semiconductor device according to the preferred embodiment. FIG. 2 is a plan view depicting relevant parts of the semiconductor device according to the preferred embodiment. FIG. 3 is a perspective view depicting relevant parts of the semiconductor device according to the preferred embodiment. FIG. 4 is an enlarged view depicting relevant parts of external connecting terminals of the semiconductor device according to the preferred embodiment. Note that a sealing member 18 is not illustrated in FIGS. 2 to 4. FIG. 1 is a cross-sectional view along dashed-dotted line Y-Y of FIG. 2, and FIG. 4 is a cross-sectional view along dashed-dotted line X-X of FIG. 2. Note also that, in the preferred embodiment, the term "front surface" refers to a surface facing upward in a semiconductor device 10 of FIGS. 1 to 4. Similarly, the term "upward" refers to an upper direction in relation to the semiconductor device 10 of FIGS. 1 to 4. For example, in the case of a ceramic circuit board 12, a surface on which a semiconductor chip 11 is mounted is its front surface, and a side on which the semiconductor chip 11 is mounted is upward. The term "rear surface" refers to a surface facing downward in the semiconductor device 10 of FIGS. 1 to 4. Similarly, the term "downward" refers to a lower direction in relation to the semiconductor device 10 of FIGS. 1 to 4. For example, in the case of the ceramic circuit board 12, a surface to which a heatsink 13 is bonded is its rear surface, and a side to which the heatsink 13 is bonded is downward. In figures other than FIGS. 1 to 4, the terms front surface, rear surface, upward, and downward also hold the same directional meanings.

The semiconductor device 10 includes the semiconductor chip 11, the ceramic circuit board 12 with the semiconductor chip 11 bonded to its front surface, the heatsink 13 bonded to the rear surface of the ceramic circuit board 12, and an external connecting terminal 16. In addition, the semiconductor device 10 is configured by housing these components in a case 15 and fixedly encapsulating them with the sealing member 18. Note that FIGS. 1 to 3 individually depict a half of the semiconductor device 10, where the external connecting terminal 16 is embedded.

The semiconductor chip 11 includes a switching element, such as a power MOSFET or IGBT, made of silicon or silicon carbide. In this case, the semiconductor chip 11 includes main electrodes provided on each of its front and rear surfaces. For example, a drain electrode (positive electrode, or collector electrode in the case of the IGBT) is provided on the rear surface to function as a main electrode, and a gate electrode (control electrode) and a source electrode (negative electrode, or emitter electrode in the case of the IGBT) are provided on the front surface to function as main electrodes. Where appropriate, the semiconductor chip 11 may include a diode, such as an SBD (Schottky barrier diode) or FWD. In this case, the semiconductor chip 11 includes a cathode electrode on its rear surface as a main electrode and an anode electrode on its front surface as a main electrode. The semiconductor chip 11 may include a switching element such as an RC-IGBT configured by integrating an IGBT and an FWD into one chip. Note that FIG. 1 illustrates only one semiconductor chip 11 mounted on the ceramic circuit board 12; however, the number of semiconductor chips 11 is merely an example and not a limitation, and may therefore be decided accordingly based on the design.

The ceramic circuit board 12 includes an insulating plate 12a, a circuit pattern 12b formed on the front surface of the insulating plate 12a, and a metal plate 12c formed on the rear surface of the insulating plate 12a. The insulating plate 12a is made of ceramics with high thermal conductivity, such as aluminum oxide, aluminum nitride, or silicon nitride, which conduct heat well. The insulating plate 12a preferably has a thickness between 0.2 mm inclusive and 1.5 mm inclusive, and more preferably between 0.25 mm inclusive and 1.0 mm inclusive. In place of the ceramic circuit board 12, a resin circuit board (not illustrated) may be used. The resin circuit board is made up of a metal plate, an insulating resin plate, and a circuit pattern. The metal plate is made of a metal material with good thermal conductivity, such as aluminum or copper. The insulating resin plate is made of insulating resin. As for the insulating resin plate, there is no particular restriction on the material to be used, provided that it is a resin with insulation properties. Note however that it is yet preferable that the resin has good thermal conductivity to effectively manage heat dissipation of the semiconductor chip 11. Specifically, a liquid crystal polymer resin or epoxy resin, for example, may be used as the material with good thermal conductivity. Such a resin is laminated on a metal plate, to thereby form the insulating resin plate.

The circuit pattern 12b is made of a material with excellent electrical conductivity. The material is, for example, copper, aluminum, or an alloy composed of at least one of these. The circuit pattern 12b preferably has a thickness between 0.1 mm inclusive and 1.0 mm inclusive, and more preferably between 0.125 mm inclusive and 0.6 mm inclusive. Onto the circuit pattern 12b, the semiconductor chip 11 is bonded via solder 14a. Note that, other than the semiconductor chip 11, electronic components such as a thermistor and a capacitor, bonding wires, and wiring members such as a lead frame and a connecting terminal may appropriately be arranged on the circuit pattern 12b. FIG. 1 illustrates the case where the circuit pattern 12b and the external connecting terminal 16 to be described later are electrically connected to each other by a bonding wire 17. Herewith, the main electrode on the rear surface of the semiconductor chip 11 is electrically connected to the external connecting terminal 16 via the circuit pattern 12b and the bonding wire 17. Note that a different lead frame may be used in place of the bonding wire 17 to provide electrical connection between the circuit pattern 12b and the external connecting terminal 16. Alternatively, the one end of the external connecting terminal 16, located inside the case 15 may be extended to directly connect to the circuit pattern 12b. Plating using a material with excellent corrosion resistance may be applied to the circuit pattern 12b. The material is, for example, aluminum, nickel, titanium, chromium, molybdenum, tantalum, niobium, tungsten, vanadium, bismuth, zirconium, hafnium, gold, silver, platinum, palladium, or an alloy composed of at least one of these. Note here that the number, layout, and shape of the circuit patterns 12b illustrated in FIGS. 1 to 3 are merely examples and not limitations, and may therefore be decided accordingly based on the design. The metal plate 12c is made of metal having excellent thermal conductivity, such as copper, aluminum, iron, silver, or an alloy composed of at least one of these. The metal plate 12c preferably has a thickness between 0.1 mm inclusive and 1.0 mm inclusive, and more preferably between 0.125 mm inclusive and 0.6 mm inclusive.

As the ceramic circuit board 12 configured as described above, a DCB (direct copper bonding) substrate or AMB (active metal brazed) substrate may be used, for example. The ceramic circuit board 12 conducts heat generated in the semiconductor chip 11 through the circuit pattern 12b, the insulating plate 12a, and the metal plate 12c to the heatsink 13. Note that the insulating plate 12a has, for example, a rectangular shape in a plan view. The metal plate 12c also has a rectangular shape in a plan view, which has an area smaller than that of the insulating plate 12a. Hence, the ceramic circuit board 12 has, for example, a rectangular shape. Note that the number, layout, and shape of the ceramic circuit boards 12 illustrated in FIGS. 1 to 3 are merely examples and not limitations, and may therefore be decided accordingly based on the design.

As for the heatsink 13, the ceramic circuit board 12 is placed on the front surface of the heatsink 13 via solder 14b, as illustrated in FIG. 1. The heatsink 13 is made of a material having excellent thermal conductivity, such as aluminum, iron, silver, copper, or an alloy composed of at least one of these. Alternatively, the heatsink 13 may be made of a composite material composed of aluminum and silicon carbide, or a composite material composed of magnesium and silicon carbide, offering excellent thermal conductivity. In addition, in order to provide improved corrosion resistance, for example, nickel plating or the like is applied to coat the surface of the heatsink 13. Specifically, other than nickel, a nickel-phosphorus alloy or nickel-boron alloy may be used. Note that, to improve heat dissipation, a cooler (not illustrated) may be provided on the rear surface of the heatsink 13 by bonding the cooler with solder, silver solder, or the like, or mechanically fixing it using thermal paste or the like. In this case, the cooler is made of a material with excellent electrical conductivity. The material is, for example, aluminum, iron, silver, copper, or an alloy composed of at least one of these. As the cooler, a fin, a heatsink with a plurality of fins, or a water cooling system may be used, for example. In addition, the heatsink 13 may be integrally formed with such a cooler. In that case, the heatsink 13 is made of a material with excellent thermal conductivity, such as aluminum, iron, silver, copper, or an alloy composed of at least one of these. Then, in order to provide improved corrosion resistance, for example, nickel plating or the like is applied to coat the surface of the heatsink 13 integrally formed with the cooler. Specifically, other than nickel, a nickel-phosphorus alloy or nickel-boron alloy may be used. Alternatively, the cooler described above may be bonded, in place of the above-described heatsink 13, to the rear surface of the ceramic circuit board 12 via the solder 14b. Note that the solder 14a and 14b used in the semiconductor device 10 is made of a lead-free solder whose principal component is at least one alloy selected from, for example, a tin-silver-copper alloy, a tin-zinc-bismuth alloy, a tin-copper alloy, and a tin-silver-indium-bismuth alloy. Further, the lead-free solder may include an additive, such as nickel, germanium, cobalt, or silicon.

The case 15 includes a frame portion 15a and a terminal disposition portion 15b. The frame portion 15a includes inner wall surfaces 15a2 facing an open area 15a1 in which the semiconductor chip 11 and the like are installed, and embeds the external connecting terminal 16 therein. The frame portion 15a is formed such that the open area 15a1 in the center of the frame portion 15a is surrounded by the inner wall surfaces 15a2 to have a rectangular shape in a plan view. The terminal disposition portion 15b includes a disposition surface 15b1 projecting toward the open area 15a1 from each of a pair of opposing shorter sides amongst the inner wall surfaces 15a2 of the frame portion 15a; and an inner wall surface 15b2 facing the open area 15a1. The terminal disposition portion 15b embeds the external connecting terminal 16 therein such that an exposure region 16a1 on a front surface 16a of the external connecting terminal 16 is exposed from the disposition surface 15b1. Note that the bonding wire 17 is connected to the exposure region 16a1 of the external connecting terminal 16, to establish electrical connection with the semiconductor chip 11.

The case 15 described above is integrally formed by injection molding from a thermoplastic resin that enables bonding of the case 15 to the external connecting terminal 16. As such a thermoplastic resin, any of the following may be used: a PPS (poly phenylene sulfide) resin; a PBT (polybutylene terephthalate) resin; a PBS (polybutylene succinate) resin; a PA (polyamide) resin; and an ABS (acrylonitrile butadiene styrene) resin. To the case 15, the heatsink 13 on which the semiconductor chip 11 and the ceramic circuit board 12 are disposed is fixedly attached to the frame portion 15a from the underside of the open area 15a1, using an adhesive agent (not illustrated).

The external connecting terminals 16 are affixed by insert molding, on a pair of shorter sides of the frame portion 15a in the above-described case 15. Each external connecting terminal 16 is in the form of a flat plate and has the front surface 16a and a rear surface 16b opposite to the front surface 16a. Note that, in FIGS. 1 to 4, the external connecting terminals 16 are installed in the case 15 such that the front surfaces 16a face upward and the rear surfaces 16b face downward. According to the preferred embodiment, each external connecting terminal 16 is arranged in such a manner as to pass through the frame portion 15a of the case 15 with its one end disposed in the open area 15a1 of the case 15 and the other end linearly extending outside the case 15, as illustrated in FIG. 1. Specifically, on the one end side of each external connecting terminal 16, the external connecting terminal 16 extends beyond the inner wall surface 15a2 of the frame portion 15a while being embedded partially, including the rear surface 16b, in the terminal disposition portion 15b and exposed partially, including the front surface 16a, to the open area 15a1. On the other end side, the external connecting terminal 16 extends linearly in FIG. 1; however, the external connecting terminal 16 may, instead, extend upward beyond the frame portion 15a of the case 15 after passing through the frame portion 15a. In addition, the one end of each external connecting terminal 16 is embedded partially, including the rear surface 16b, into the terminal disposition portion 15b of the case 15. That is, at at least part of both sides along a pair of opposite sides of the exposure region 16a1, the disposition surface 15b1 is located between the front surface 16a and the rear surface 16b of each external connecting terminal 16 to have a level difference to the front surface 16a, as illustrated in FIGS. 3 and 4. The front surface 16a of each external connecting terminal 16 protrudes upward from the disposition surface 15b1 of the terminal disposition portion 15b. Note that FIGS. 1 and 4 depict the case where burrs and dull faces are formed on the front surface 16a and the rear surface 16b, respectively, of each external connecting terminal 16. The exposure region 16a1 of the front surface 16a on the one end side of each external connecting terminal 16 and the circuit pattern 12b of the ceramic circuit board 12 are electrically connected by the bonding wire 17. On the other hand, the other end of each external connecting terminal 16 is connected to an external power supply (not illustrated) or the like. The external connecting terminals 16 are made of aluminum, magnesium, copper, brass, stainless steel, titanium, iron or the like, or an alloy including one of these. Note that a method of forming the external connecting terminals 16 is described later.

As illustrated in FIG. 1, an insulating adhesive agent 14c is disposed between the rear surface of the terminal disposition portion 15b of the case 15 and the heatsink 13. The insulating adhesive agent 14c provides bonding between the heatsink 13 and the case 15, and also prevents the sealing member 18 from leaking out from a gap between the heatsink 13 and the case 15 by filling the gap.

In addition, the sealing member 18 fills the open area 15a1 of the case 15, as described above, to fixedly encapsulate the ceramic circuit boards 12, the semiconductor chips 11, the bonding wires 17, the external connecting terminals 16 and the like over the heatsink 13. The sealing member 18 includes a thermosetting resin, such as a maleimide-modified epoxy resin, a maleimide-modified phenolic resin, or a maleimide resin, and a filler material contained in the thermosetting resin. Specifically, the sealing member 18 is made of, for example, epoxy resin including a filler material, such as silicon oxide, aluminum oxide, boron nitride, or aluminum nitride.

Figure 5A:
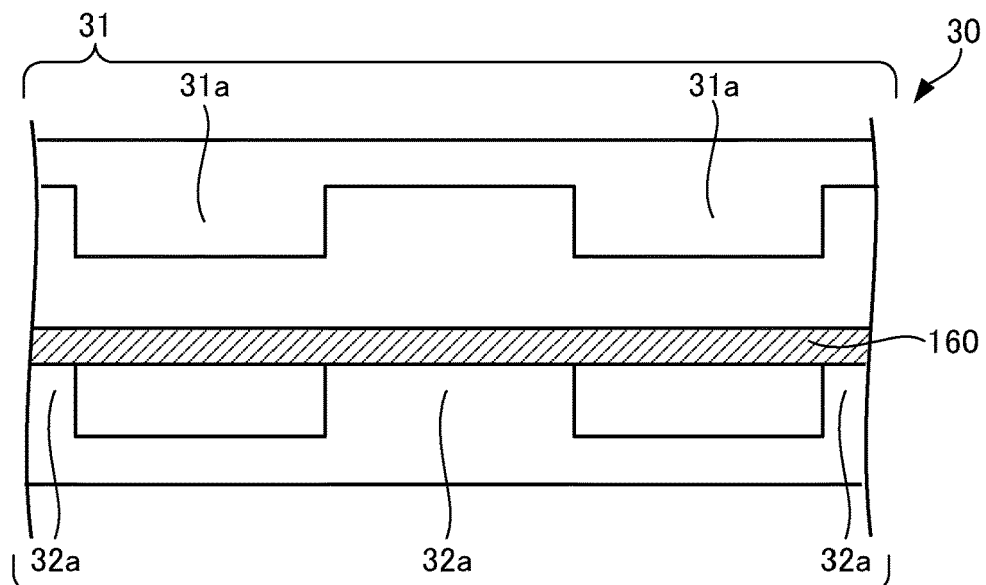
FIGS. 5A to 5C illustrate a method of forming the external connecting terminals of the semiconductor device according to the preferred embodiment.
Figure 5B:
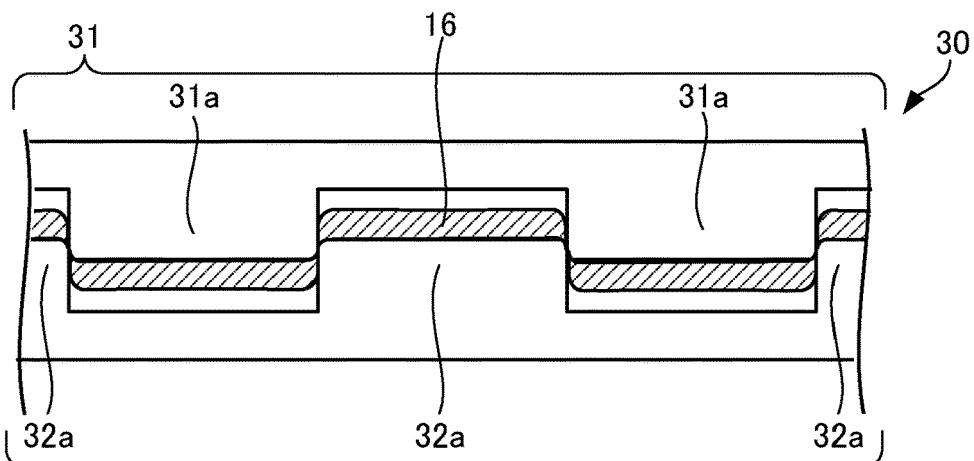
Figure 5C:
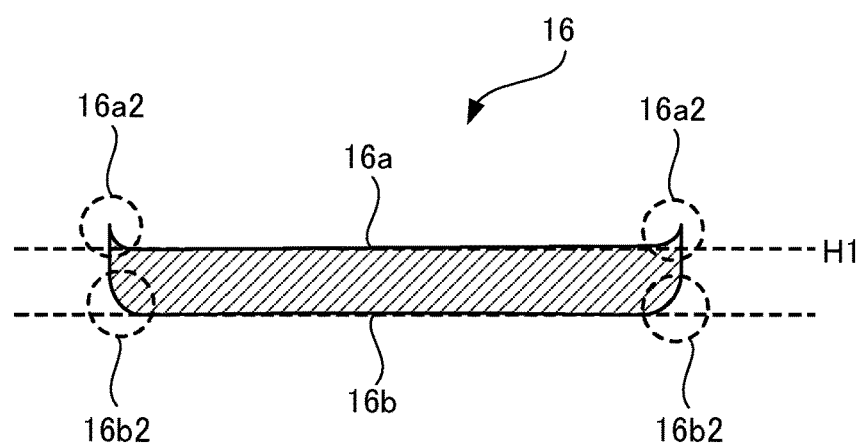

Next described is a method of forming the external connecting terminals 16, with reference to FIGS. 5A to 5C. FIGS. 5A to 5C illustrate the method of forming the external connecting terminals of the semiconductor device according to the preferred embodiment. Note that FIGS. 5A and 5B represent formation steps of the external connecting terminals 16 in chronological order. FIG. 5C illustrates the external connecting terminals 16 formed through the steps depicted in FIGS. 5A and 5B.

First, a punching apparatus 30 is prepared, which includes a pressing unit 31 with a plurality of punches 31a and a supporting unit 32 with a plurality of dies 32a. The pressing unit 31 and the supporting unit 32 are arranged such that the punches 31a and the dies 32a slot together when the pressing unit 31 meets the supporting unit 32. In the punching apparatus 30, a sheet 160 made of the same material as the external connecting terminals 16 is set on the dies 32a of the supporting unit 32 (FIG. 5A). When pressing force is applied by the pressing unit 31 to the sheet 160 set securely, the cutting edges of the punches 31a and those of the dies 32a apply stresses to the sheet 160 in the pressing direction and an opposite direction from the pressing direction, respectively, thereby punching through the sheet 160 (FIG. 5B). When the cutting edges of the punches 31a and the dies 32a move past each other, the sheet 160 is subjected to stresses acting in opposite directions (i.e., the punching direction and the opposite direction) and then torn off. When the pressing unit 31 is drawn back to its original position, the external connecting terminals 16 are formed on the dies 32a. Each external connecting terminal 16 thus obtained has the front surface 16a and the rear surface 16b both being nearly horizontal, as illustrated in FIG. 5C. In addition, because each external connecting terminal 16 is formed by applying stresses in opposite directions on either side of the sheet 160 using the punches 31a and the dies 32a such that the sheet 160 is torn off, burrs 16a2 are formed on both edges of the front surface 16a. Each of the burrs 16a2 is a sharp bulge at either edge, where changes in the curvature of the nearly horizontal front surface 16a are observed. That is, the burrs 16a2 are portions on the front surface 16a, protruding out of a horizontal line H1 in FIG. 5C. Dull faces 16b2 are also formed on both edges of the rear surface 16b, corresponding to the burrs 16a2. Each of the dull faces 16b2 is a gentle arc at either edge, where changes in the curvature of the nearly horizontal rear surface 16b are observed. The contour of each external connecting terminal 16 rises perpendicular to the horizontal line H1 from the dull face 16b2 to the tip of the burr 16a2. Therefore, each lateral side of the external connecting terminal 16 is here defined as a face perpendicular to the horizontal line H1, spanning from the tip of the burr 16a2 to a point at which the dull face 16b2 starts. In addition, the thickness of the external connecting terminal 16 is defined as the distance between the nearly horizontal front and rear surfaces 16a and 16b.

The external connecting terminals 16 thus obtained are placed on a predetermined mold (not illustrated), each with the surface with the dull faces 16b2 to be the rear surface 16b. The mold with the external connecting terminals 16 set therein is heated to a predetermined temperature. Subsequently, a resin such as PPS, PBT, PPA (polyphthalamide), or nylon is poured into the mold and then cured. The mold is released, and the case 15 equipped with the external connecting terminals 16 is formed. Note that when the external connecting terminals 16 are set in the mold, the pointed parts of the burrs 16a2 on the external connecting terminals 16 are pressed flat to a certain degree.

To the case 15 thus obtained, the heatsink 13 on which the semiconductor chips 11, the ceramic circuit boards 12, and the insulating adhesive agent 14c are disposed is fixedly attached to the frame portion 15a from the underside of the open area 15a1, using an adhesive agent (not illustrated). Electrical connections between the semiconductor chips 11, the ceramic circuit boards 12, and the external connecting terminals 16 are made when needed, using the bonding wires 17. Then, the sealing member 18 fills the open area 15a1 of the case 15 housing these components to encapsulate them. Herewith, the semiconductor device 10 depicted in FIGS. 1 to 4 is obtained.

Figure 6A:
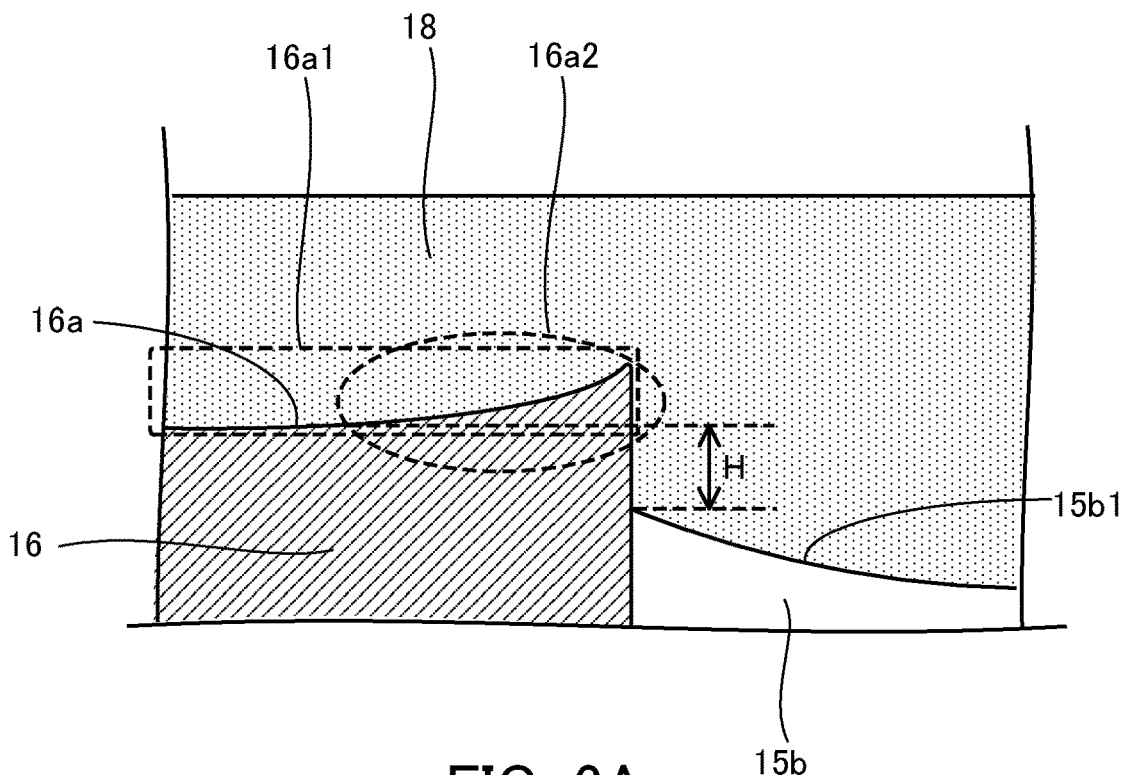
FIGS. 6A and 6B are cross-sectional views depicting relevant parts of an external connecting terminal insert molded into a case of the semiconductor device according to the preferred embodiment.
Figure 6B:
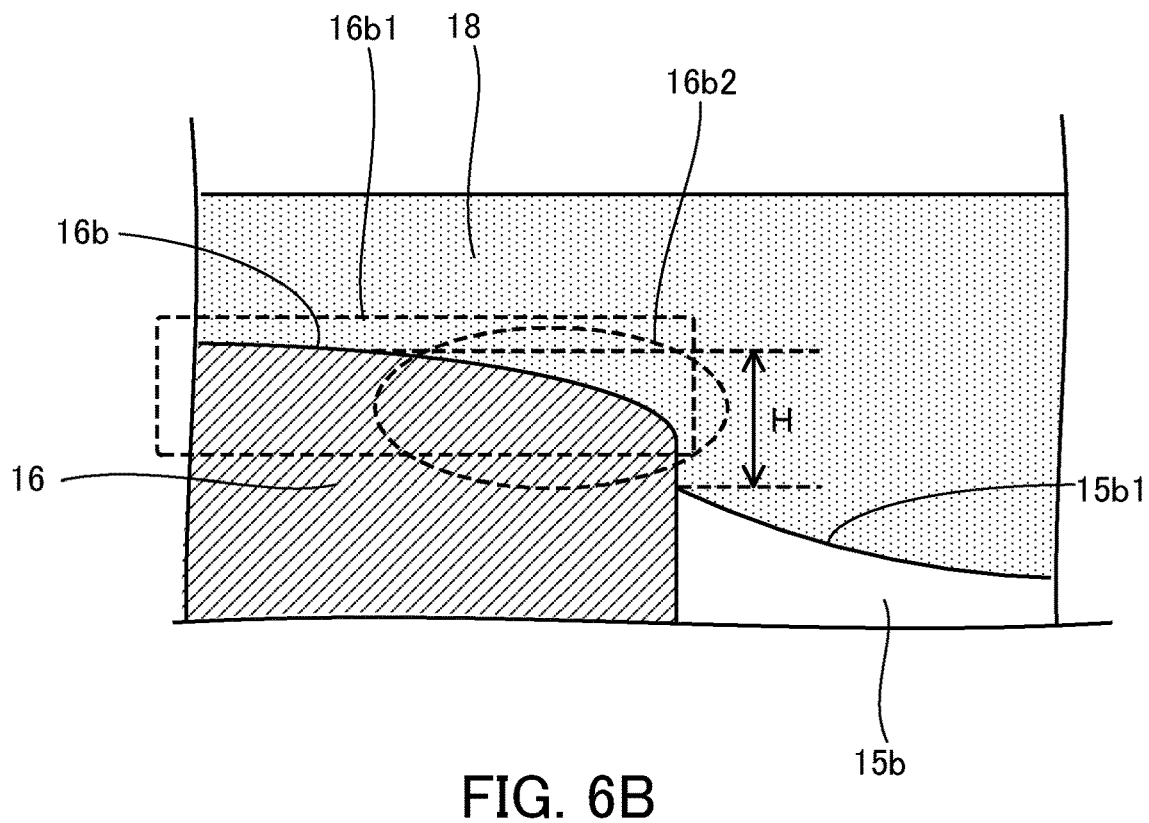

Next described are each external connecting terminal 16 and its neighboring part of the semiconductor device 10 thus obtained, with reference to FIGS. 6A and 6B. FIGS. 6A and 6B are cross-sectional views depicting relevant parts of an external connecting terminal insert molded into the case of the semiconductor device according to the preferred embodiment. Note that FIGS. 6A and 6B are cross-sectional views of the external connecting terminal 16 along dashed-dotted line X-X of FIG. 1. FIG. 6A provides a magnified view in the vicinity of the burr 16a2 on the front surface 16a while FIG. 6B provides a magnified view in the vicinity of the dull face 16b2 on the rear surface 16b. Note also that FIG. 6A depicts the case where the front surface 16a with the burr 16a2 of the external connecting terminal 16 attached to the case 15 faces upward, and FIG. 6B depicts the case where the rear surface 16b with the dull face 16b2 of the external connecting terminal 16 attached to the case 15 faces upward.

To form the case 15, the external connecting terminals 16 are set in a predetermined mold, and a resin is then poured into the mold, as described above. In this regard, the mold is designed such that the front surfaces 16a with the burrs 16a2 of the external connecting terminals 16 protrude upward from the disposition surface 15b1 of the terminal disposition portion 15b in the case 15. Therefore, the resin poured into the mold does not go over the burrs 16a2 of the front surfaces 16a and is thus prevented from flowing over the front surfaces 16a and then cures. As a result, the disposition surface 15b1 of the terminal disposition portion 15b, in which the external connecting terminals 16 are embedded, is located between the front surface 16a and the rear surface 16b (not illustrated) of each external connecting terminal 16 and, thus has a level difference to the front surface 16a, as illustrated in FIG. 6A. The resin poured into the mold therefore does not go over the burrs 16a2 and thus not reach the front surface 16a. This prevents interfacial debonding between the external connecting terminals 16 and the terminal disposition portion 15b of the case 15 from easily developing. Note that the height of the level difference between the front surface 16a of each external connecting terminal 16 and the disposition surface 15b1 is denoted by H. When the case 15 and the external connecting terminals 16 thus formed are sealed together with the sealing member 18, the sealing member 18 does not enter a debonding gap, thus curbing further advance of the interfacial debonding. This in turn secures insulation of circuits inside the semiconductor device 10. In addition, because water is prevented from entering inside through the debonding gap, corrosion or the like of internal parts of the semiconductor device 10 is less likely to occur. Further, prevention of the advance of the interfacial debonding facilitates strong embedding of the external connecting terminals 16 into the terminal disposition portion 15b of the case 15. This prevents the external connecting terminals 16 from being displaced even if thermal stress is generated due to the thermal cycles or the like. As a result, shear stress at each bonding section where the bonding wire 17 is connected to the external connecting terminal 16 is suppressed, which prevents breakage of the bonding section. Note that FIG. 6A only illustrates the right side of the external connecting terminal 16 and its vicinity; however, the same goes for the left side of the external connecting terminal 16 and its vicinity.

The case where each external connecting terminal 16 is disposed in the case 15 such that the rear surface 16b with the dull faces 16b2 faces upward also produces the same results as in the case of FIG. 6A above. That is, the disposition surface 15b1 of the terminal disposition portion 15b of the case 15, in which the external connecting terminals 16 are embedded, has a level difference to an exposure region 16b1 on the rear surface 16b of each external connecting terminal 16, as illustrated in FIG. 6B. The resin forming the case 15 therefore does not go over the dull faces 16b2 of the external connecting terminals 16 and thus not reach the rear surfaces 16b. As a result, this case also achieves the same effects as in the case of FIG. 6A above. Note that the height of the level difference between the rear surface 16b of each external connecting terminal 16 and the disposition surface 15b1 is H. Note however that the burrs 16a2 of the external connecting terminals 16 of FIG. 6A have a better effect on preventing the resin from going over the top of the external connecting terminals 16 compared to the dull faces 16b2 of FIG. 6B. Note that FIG. 6B only illustrates the right side of the external connecting terminal 16 and its vicinity; however, the same goes for the left side of the external connecting terminal 16 and its vicinity.

Figure 7A:
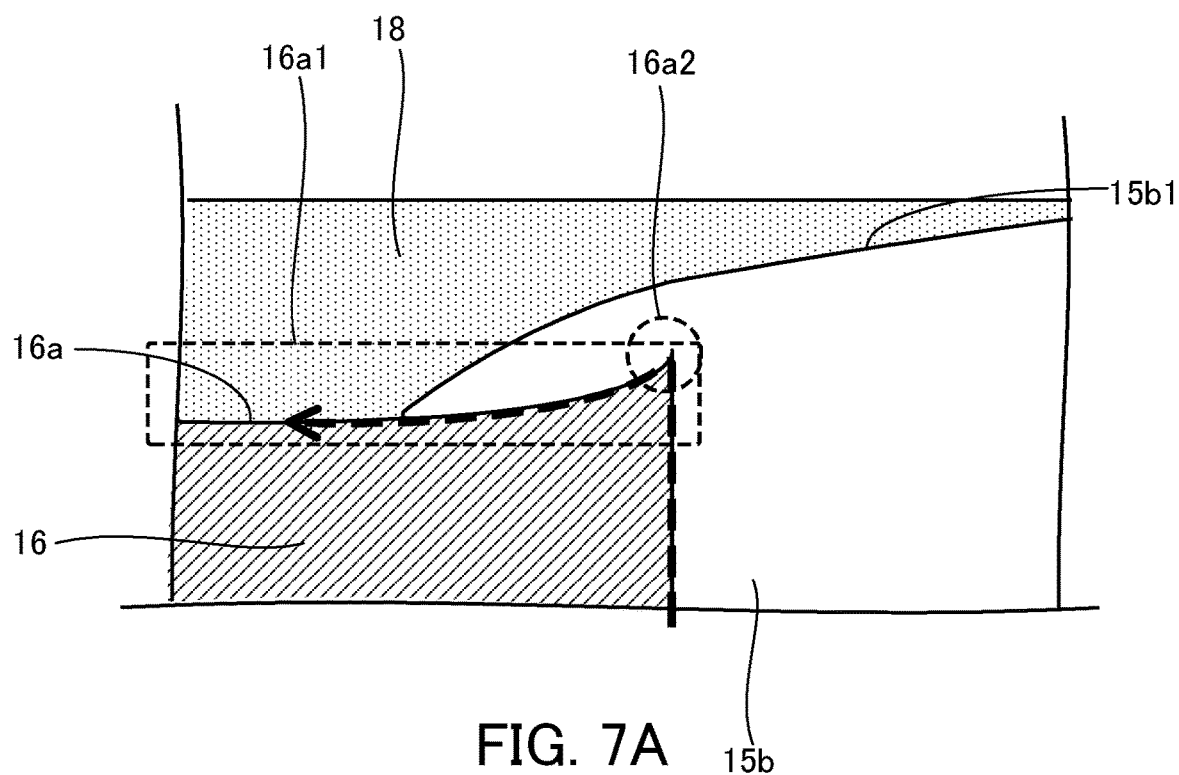
FIGS. 7A and 7B are cross-sectional views depicting relevant parts of an external connecting terminal insert molded into a case of a semiconductor device according to a comparison example.
Figure 7B:
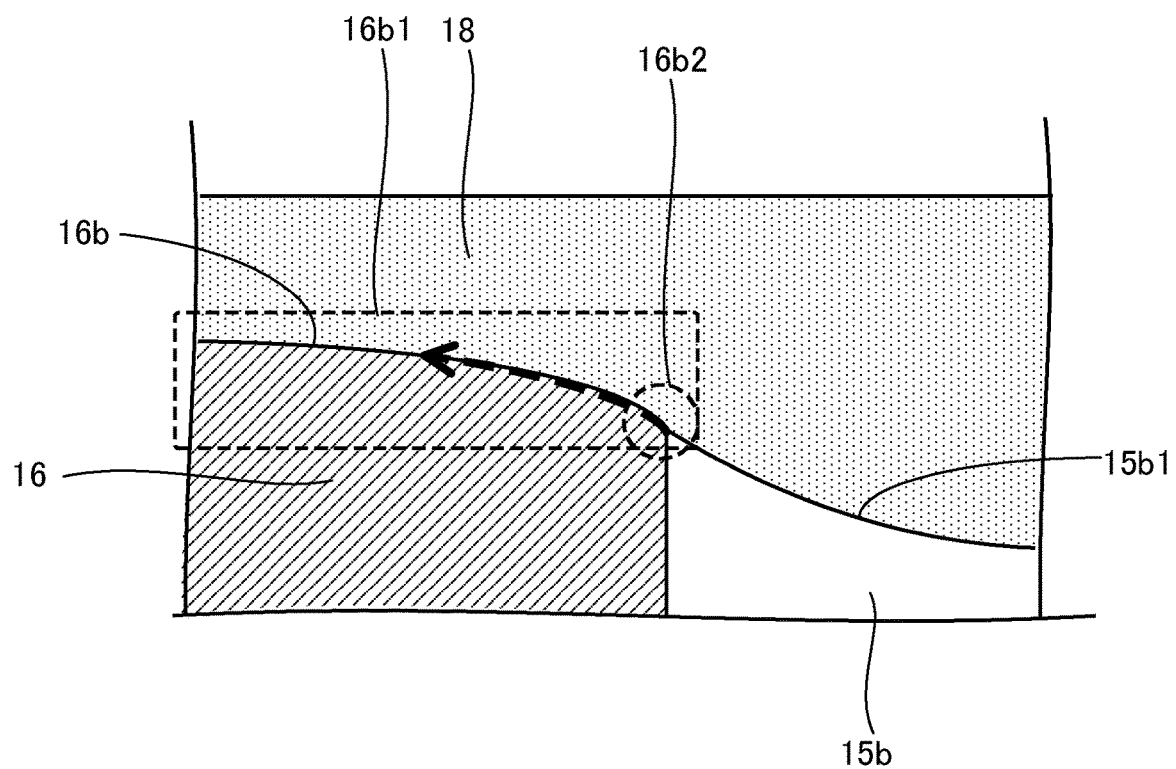

To make contrasts with the above-described preferred embodiment, next described are comparison cases where the front surface 16a and the rear surface 16b of each external connecting terminal 16 are individually made level with the disposition surface 15b1 of the terminal disposition portion 15b in the case 15, with reference to FIGS. 7A and 7B. FIGS. 7A and 7B are cross-sectional views depicting relevant parts of an external connecting terminal insert molded into the case of a semiconductor device according to the comparison examples. Note that, as in FIGS. 6A and 6B, FIG. 7A provides a magnified view in the vicinity of the burr 16a2 on the front surface 16a while FIG. 7B provides a magnified view in the vicinity of the dull face 16b2 on the rear surface 16b. Note also that FIG. 7A depicts the case where the front surface 16a with the burr 16a2 of the external connecting terminal 16 attached to the case 15 faces upward, and FIG. 7B depicts the case where the rear surface 16b with the dull face 16b2 of the external connecting terminal 16 attached to the case 15 faces upward.

In this case also, to form the case 15, the external connecting terminals 16 are set in a predetermined mold, and a resin is then poured into the mold. In this regard, the mold is designed such that the front surfaces 16a with the burrs 16a2 of the external connecting terminals 16 are made level with the disposition surface 15b1 of the terminal disposition portion 15b in the case 15. Therefore, the resin poured into the mold goes over the burrs 16a2 of the front surfaces 16a and flows over the front surfaces 16a and then cures. As a result, burrs of the case 15 extend into the front surfaces 16a of the external connecting terminals 16, as illustrated in FIG. 7A. Therefore, if the semiconductor device 10 is formed by sealing together the case 15 and the external connecting terminals 16 in this condition with the sealing member 18, debonding is likely to develop, due to thermal stress caused by the thermal cycles or the like, at the interface between the case 15 and the external connecting terminals 16 in the direction indicated by the dashed arrow in FIG. 7A. In addition, the configuration of FIG. 7A leaves, in each external connecting terminal 16, less area available for connection with the bonding wire 17.

The case where the rear surfaces 16b with the dull faces 16b2 of the external connection terminals 16 are made level with the disposition surface 15b1 of the terminal disposition portion 15b in the case 15 also produces the same results as in the case of FIG. 7A. That is, the resin poured into the mold goes over the dull faces 16b2 of the external connecting terminals 16 and flows over the rear surfaces 16b and then cures, as illustrated in FIG. 7B. Especially, the dull faces 16b2 easily let the resin flow over them compared to the burrs 16a2. Therefore, if the semiconductor device 10 is formed by sealing together the case 15 and the external connecting terminals 16 in this condition with the sealing member 18, debonding is likely to develop, due to thermal stress caused by the thermal cycles or the like, at the interface between the case 15 and the external connecting terminals 16 in the direction indicated by the dashed arrow in FIG. 7B.

In view of the above-described problems, the semiconductor device 10 according to the preferred embodiment includes the semiconductor chip 11; and the external connecting terminal 16 formed in a flat plate shape and having the front surface 16a electrically connected to the semiconductor chip 11 and the rear surface 16b opposite to the front surface 16a. The semiconductor device 10 further includes the case 15 housing the semiconductor chip 11 placed in the open area 15a1 and embedding the external connecting terminal 16 therein; and the sealing member 18 fixedly encapsulating the semiconductor chip 11 in the open area 15a1. The case 15 includes the frame portion 15a which has the inner wall surface 15a2 facing the open area 15a1 and embeds the external connecting terminal 16 therein. The case 15 also includes the terminal disposition portion 15b which has the disposition surface 15b1 projecting from the inner wall surface 15a2 toward the open area 15a1, exposes the exposure region 16a1 on the front surface 16a, and embeds the rear surface 16b of the external connecting terminal 16. Further, in the case 15, the disposition surface 15b1 is located between the front surface 16a and the rear surface 16b at at least part of both sides along a pair of opposite sides of the exposure region 16a1 of the external connecting terminal 16, to have a level difference to the front surface 16a. In the semiconductor device 10 with the above-described configuration, the case 15 does not extend to the exposure region 16a1 on the front surface 16a of the external connecting terminal 16. Therefore, no sealing member 18 flows into an interfacial debonding gap between the external connecting terminal 16 and the case 15, thus curbing further advance of the interfacial debonding. This in turn secures insulation of circuits inside the semiconductor device 10. In addition, because water is prevented from entering inside through the interfacial debonding gap, corrosion or the like of internal parts of the semiconductor device 10 is less likely to occur. Further, prevention of the advance of the interfacial debonding facilitates strong embedding of the external connecting terminal 16 into the terminal disposition portion 15b of the case 15. This prevents the external connecting terminal 16 from being displaced even if thermal stress is generated due to the thermal cycles or the like. As a result, shear stress at the bonding section where the bonding wire 17 is connected to the external connecting terminal 16 is suppressed, which prevents breakage of the bonding section. This prevents reduced reliability of the semiconductor device 10.

Note that, in the semiconductor device 10 described above, each external connecting terminal 16 needs to be strongly embedded in the case 15 so that the external connecting terminals 16 would not be displaced during wire bonding while controlling inflow of resin of the case 15 to form the terminal disposition portion 15b. From this viewpoint, the level difference height H needs to be greater than or equal to a quarter of the thickness of each external connecting terminal 16 (i.e. the distance between the front surface 16a and the rear surface 16b). For example, if each external connecting terminal 16 has a thickness between 200 µm inclusive and 500 µm inclusive, the level difference height H is preferably in the range between 50 µm inclusive and 125 µm inclusive.

In view of the above, it is understood the front surface 16a of each external connecting terminal 16 does not necessarily protrude upward from the disposition surface 15b1 as long as there is a level difference between the front surface 16a of the external connecting terminal 16 and the disposition surface 15b1 of the terminal disposition portion 15b in the case 15. Next described are modifications of the preferred embodiment based on the understanding.

(First Modification)

Figure 8A:
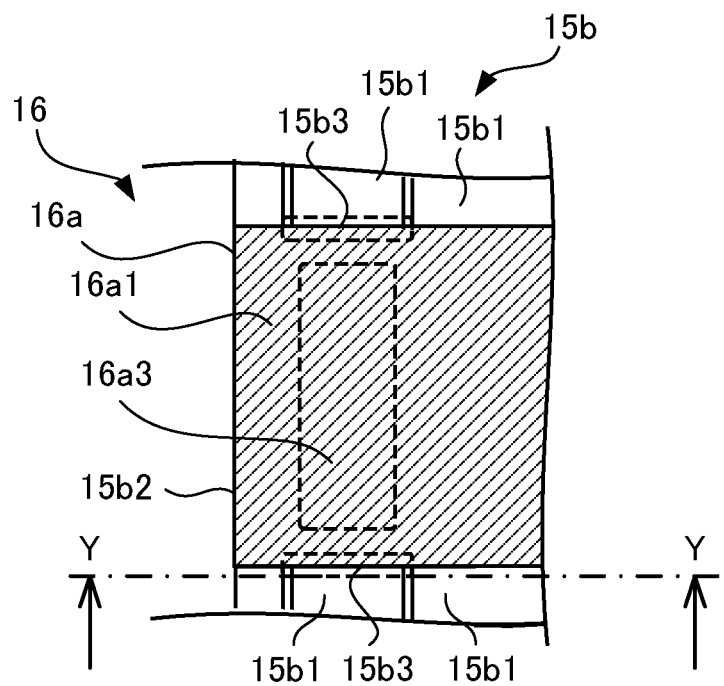
FIGS. 8A and 8B illustrate an external connecting terminal of a semiconductor device according to a first modification.
Figure 8B:
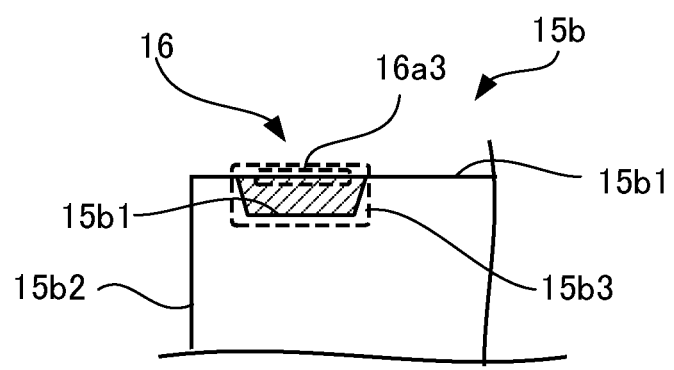

A first modification describes the case where sections of the disposition surface 15b1 individually have a level difference to the front surface 16a of the external connecting terminal 16, with reference to FIGS. 8A and 8B. The sections of the disposition surface 15b1 correspond, within the exposure region 16a1 on the front surface 16a, to a bonding section 16a3 to which the bonding wire 17 is to be connected. FIGS. 8A and 8B illustrate an external connecting terminal of a semiconductor device according to the first modification. Note that FIG. 8A is a plan view of the exposure region 16a1 on the front surface 16a of the external connecting terminal 16, and FIG. 8B is a cross-sectional view along dashed-dotted line Y-Y of FIG. 8A.

In this case, lateral stepped sections 15b3 of the disposition surface 15b1 of the case 15, which bookend the bonding section 16a3 provided in the rectangular exposure region 16a1 of the external connecting terminal 16, are individually located between the front surface 16a and the rear surface 16b of the external connecting terminal 16 such that each of the lateral stepped sections 15b3 has a level difference to the front surface 16a. In this manner, the front surface 16a of the external connecting terminal 16 is arranged to protrude upward from the lateral stepped sections 15b3 of the disposition surface 15b1. The lateral stepped sections 15b3 of the case 15 may be recessed from the remaining disposition surface 15b1. The disposition surface 15b1 other than the lateral stepped sections 15b3 may be made level with the front surface 16a of the exposure region 16a1. Alternatively, the remaining disposition surface 15b1 may be depressed downward relative to the front surface 16a in the exposure region 16a1. With this configuration, during the formation of the case 15, the resin of the case 15 does not extend at least to the bonding section 16a3 of the external connecting terminal 16. As a result, the space for the bonding section 16a3 is secured. In addition, advance of interfacial debonding between the external connecting terminal 16 and the case 15 is prevented to some extent.

(Second Modification)

Figure 9A:
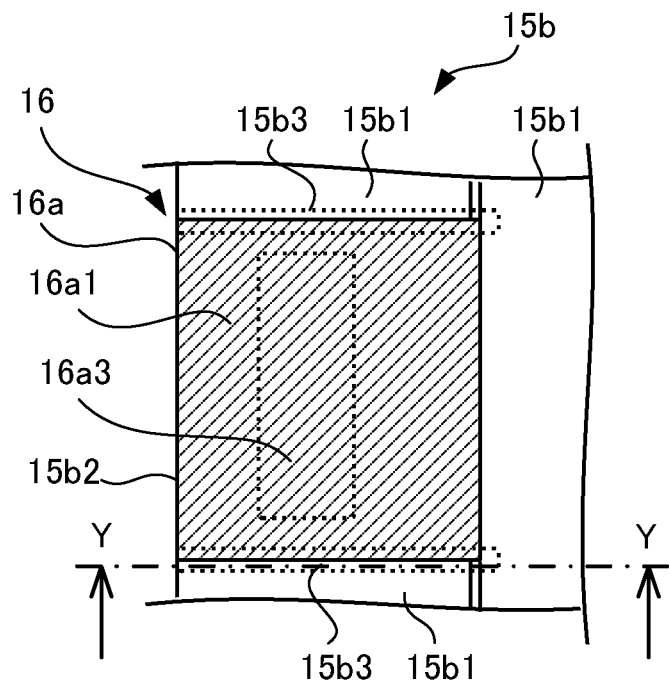
FIGS. 9A and 9B illustrate an external connecting terminal of a semiconductor device according to a second modification.
Figure 9B:
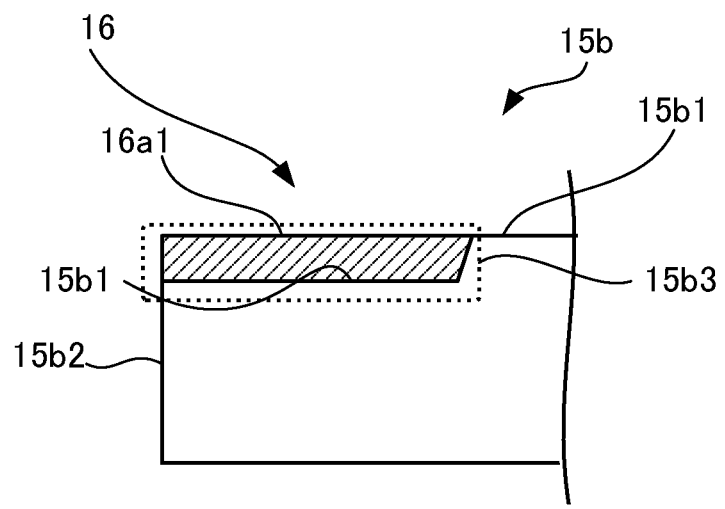

A second modification describes the case where the disposition surface 15b1 has a level difference at each side of the exposure region 16a1 on the front surface 16a of the external connecting terminal 16, with reference to FIGS. 9A and 9B. FIGS. 9A and 9B illustrate an external connecting terminal of a semiconductor device according to the second modification. Note that FIG. 9A is a plan view of the exposure region 16a1 on the front surface 16a of the external connecting terminal 16, and FIG. 9B is a cross-sectional view along dashed-dotted line Y-Y of FIG. 9A.

In this case also, the lateral stepped sections 15b3 of the disposition surface 15b1 of the case 15, which bookend the rectangular exposure region 16a1 of the external connecting terminal 16, are located between the front surface 16a and the rear surface 16b of the external connecting terminal 16 such that each of the lateral stepped sections 15b3 has a level difference to the front surface 16a. In this manner, the front surface 16a of the external connecting terminal 16 is arranged to protrude upward from the lateral stepped sections 15b3 on the disposition surface 15b1 of the case 15. The lateral stepped sections 15b3 may be formed along the entire length of a pair of opposite sides of the exposure region 16a1. The lateral stepped sections 15b3 of the case 15 may be recessed from the remaining disposition surface 15b1. The disposition surface 15b1 other than the lateral stepped sections 15b3 may be made level with the front surface 16a of the exposure region 16a1. Alternatively, the remaining disposition surface 15b1 may be depressed downward relative to the front surface 16a in the exposure region 16a1. With this configuration, during the formation of the case 15, the resin of the case 15 does not extend at least to the bonding section 16a3 of the external connecting terminal 16, as in the case of the first modification. As a result, the space for the bonding section 16a3 is secured. In addition, advance of interfacial debonding between the external connecting terminal 16 and the case 15 is prevented to some extent.

(Third Modification)

Figure 10A:
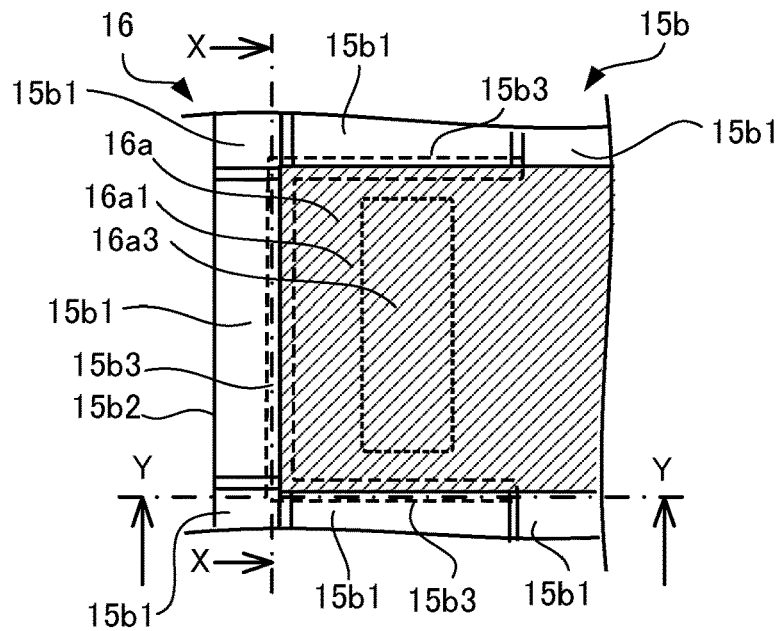
FIGS. 10A to 10C illustrate an external connecting terminal of a semiconductor device according to a third modification.
Figure 10B:
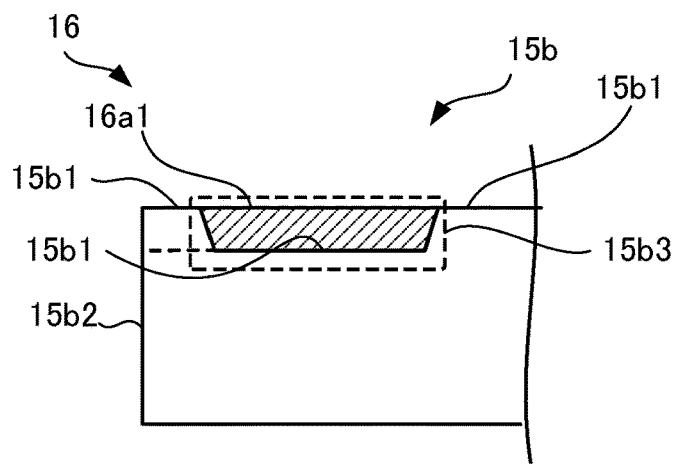
Figure 10C:
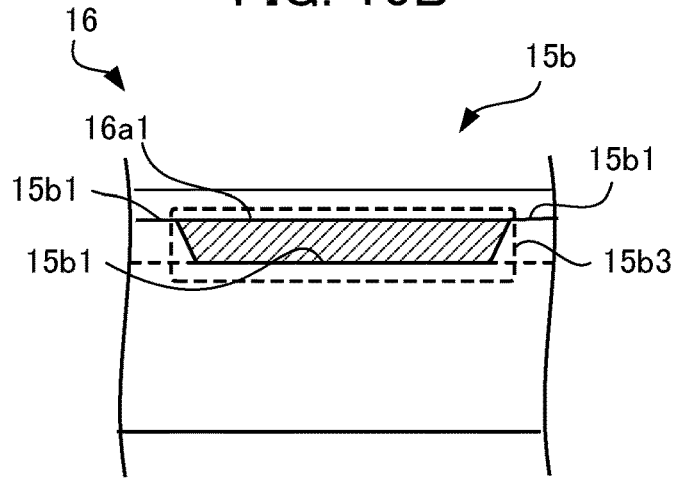

A third modification describes the case where the disposition surface 15b1 of the case 15 has a level difference on three sides of the exposure region 16a1 of the external connecting terminal 16, with reference to FIGS. 10A to 10C. FIGS. 10A to 10C illustrate an external connecting terminal of a semiconductor device according to the third modification. Note that FIG. 10B is a cross-sectional view along dashed-dotted line Y-Y of FIG. 10A, and FIG. 10C is a cross-sectional view along dashed dotted line X-X of FIG. 10A.

In this case also, the exposure region 16a1 of the external connecting terminal 16 is exposed in a rectangular shape from the case 15, as illustrated in FIGS. 10A to 10C. The lateral stepped sections 15b3 on the disposition surface 15b1 of the case 15 are individually located between the front surface 16a and the rear surface 16b of the external connecting terminal 16 such that each of the lateral stepped sections 15b3 has a level difference to the front surface 16a. In this manner, the front surface 16a of the external connecting terminal 16 is arranged to protrude upward from the lateral stepped sections 15b3 of the disposition surface 15b1 in the case 15. According to the third modification, the lateral stepped sections 15b3 of the case 15 are disposed on three sides of the exposure region 16a1. The lateral stepped sections 15b3 may be recessed from the remaining disposition surface 15b1. The disposition surface 15b1 other than the lateral stepped sections 15b3 may be made level with the front surface 16a of the exposure region 16a1. Alternatively, the remaining disposition surface 15b1 may be depressed downward relative to the front surface 16a in the exposure region 16a1. With this configuration, during the formation of the case 15, the resin of the case 15 does not extend at least to the bonding section 16a3 of the external connecting terminal 16, as in the case of the first and second modifications. As a result, the space for the bonding section 16a3 is secured. In addition, advance of interfacial debonding between the external connecting terminal 16 and the case 15 is prevented to some extent.

(Fourth Modification)

Figure 11A:
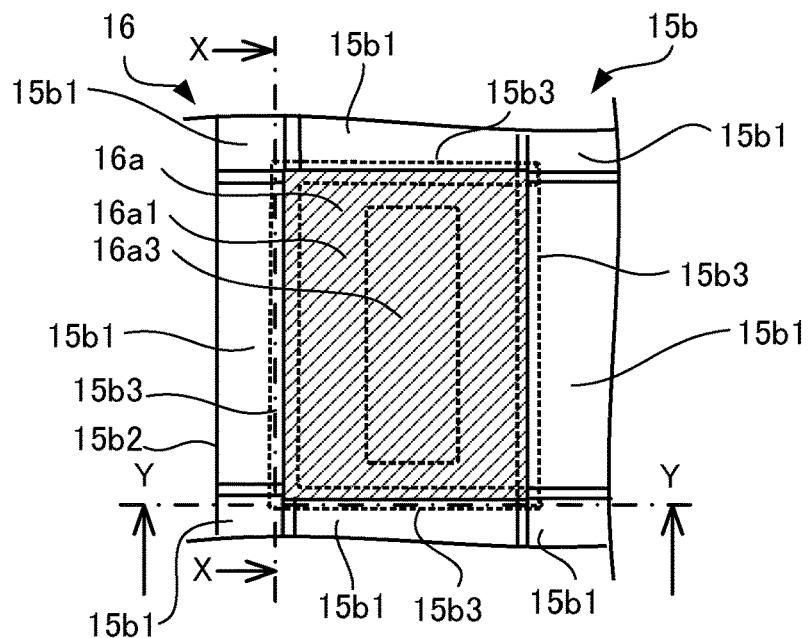
FIGS. 11A to 11C illustrate an external connecting terminal of a semiconductor device according to a fourth modification.
Figure 11B:
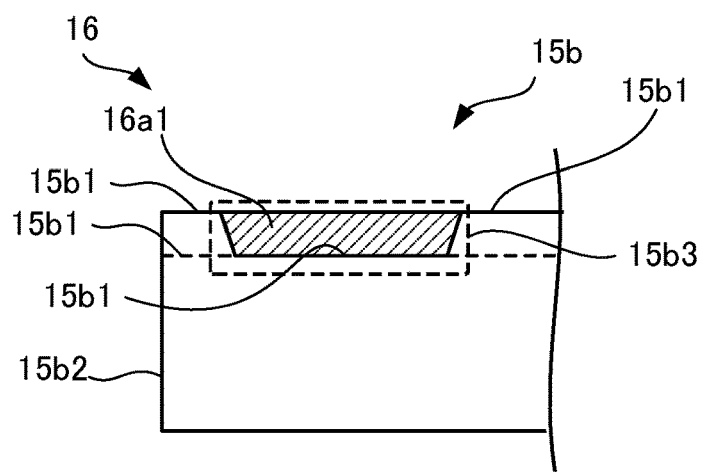
Figure 11C:
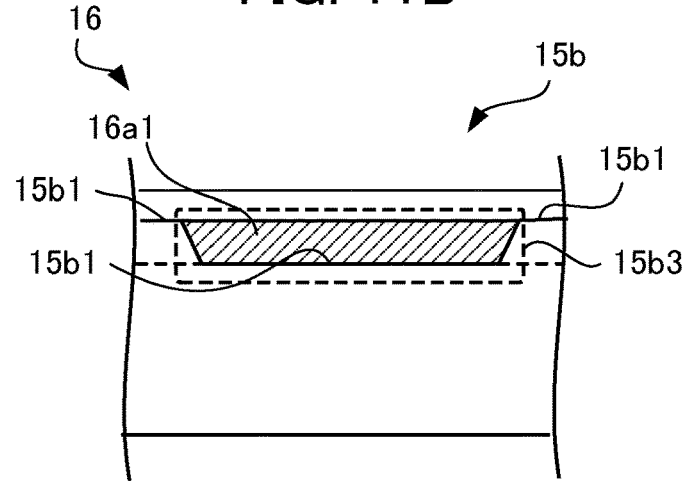

A fourth modification describes the case where the disposition surface 15b1 of the case 15 has a level difference along four sides (entire periphery) of the exposure region 16a1 of the external connecting terminal 16, with reference to FIGS. 11A to 11C. FIGS. 11A to 11C illustrate an external connecting terminal of a semiconductor device according to the fourth modification. Note that FIG. 11B is a cross-sectional view along dashed-dotted line Y-Y of FIG. 11A, and FIG. 11C is a cross-sectional view along dashed-dotted line X-X of FIG. 11A.

In this case also, the exposure region 16a1 of the external connecting terminal 16 is exposed in a rectangular shape from the case 15, as illustrated in FIGS. 11A to 11C. The lateral stepped sections 15b3 of the disposition surface 15b1 of the case 15 are located between the front surface 16a and the rear surface 16b of the external connecting terminal 16 such that each of the lateral stepped sections 15b3 has a level difference to the front surface 16a. In this manner, the front surface 16a of the external connecting terminal 16 is arranged to protrude upward from the lateral stepped sections 15b3 on the disposition surface 15b1 of the case 15. According to the fourth modification, the lateral stepped sections 15b3 of the case 15 are disposed on four sides of the exposure region 16a1. The lateral stepped sections 15b3 may be recessed from the remaining disposition surface 15b1. The disposition surface 15b1 other than the lateral stepped sections 15b3 may be made level with the front surface 16a of the exposure region 16a1. Alternatively, the remaining disposition surface 15b1 may be depressed downward relative to the front surface 16a in the exposure region 16a1. With this configuration, during the formation of the case 15, the resin of the case 15 does not extend at least to the bonding section 16a3 of the external connecting terminal 16, as in the case of the first, second, and third modifications. As a result, the space for the bonding section 16a3 is secured. In addition, advance of interfacial debonding between the external connecting terminal 16 and the case 15 is prevented to some extent.

Note that the first to fourth modifications are directed to the case where a level difference is provided between the front surface 16a and the disposition surface 15b1 while the front surface 16a of the external connecting terminal 16, with the burrs 16a2 formed thereon, faces upward. However, the same effects as in the first to fourth modifications are also achieved when the rear surface 16b of the external connecting terminal 16, with the dull faces 16b2 formed thereon, faces upward.

(Fifth Modification)

Figure 12:
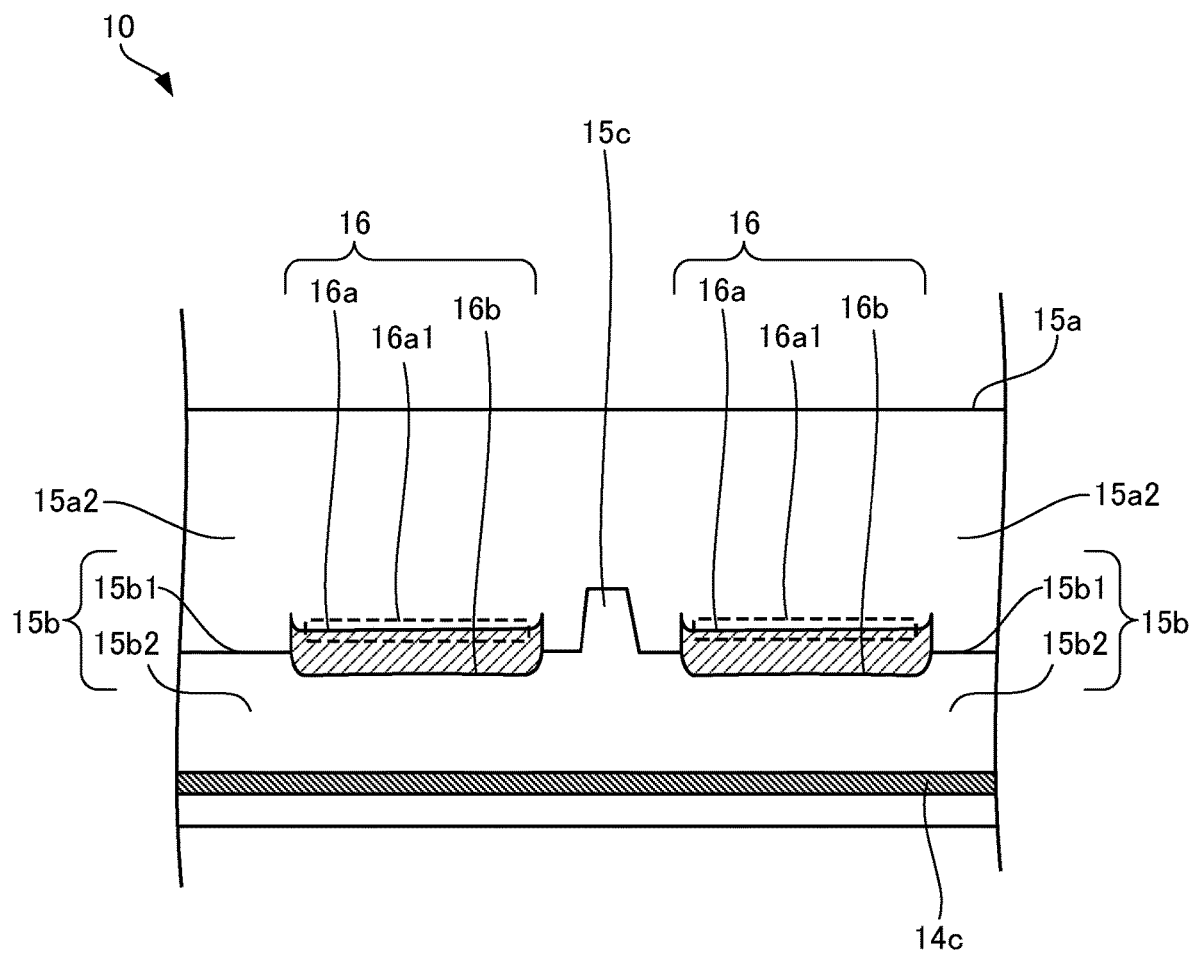
FIG. 12 illustrates a case of a semiconductor device according to a fifth modification.

A fifth modification is directed to providing a configuration illustrated in FIG. 12 in addition to, or separately from, the configurations according to the first to fourth modifications in which the lateral stepped sections 15b3 of the case 15 have a level difference. FIG. 12 illustrates a case of a semiconductor device according to the fifth modification. Note that FIG. 12 is an enlarged view depicting relevant parts at a site corresponding to that of FIG. 4. In FIG. 12, like components to those of FIG. 4 are denoted by like reference numerals.

The semiconductor device 10 of FIG. 12 is formed by providing the case 15 of the semiconductor device 10 of FIG. 4 with an inter-terminal projection 15c disposed between the external connecting terminals 16 on the disposition surface 15b1 of the terminal disposition portion 15b. The inter-terminal projection 15c increases the creeping distance (insulation distance) between the external connecting terminals 16, which in turn better secures insulation between the external connecting terminals 16. According to the fifth modification, the inter-terminal projection 15c is convex; however, the shape of the inter-terminal projection 15c is not limited to this case, and may be concave or convex-concave to increase the creeping distance (insulation distance) between the external connecting terminals 16.

The semiconductor device with the above-described configuration curbs the advance of interfacial debonding between the case and each external connecting terminal, thereby preventing reduced reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a semiconductor chip;
   an external connecting terminal having a flat plate shape, the external connecting terminal including a front surface having an exposure region and being electrically connected to the semiconductor chip, and a rear surface opposite to the front surface;
   a case including a frame portion and a terminal disposition portion, the frame portion having an inner wall surface surrounding an open area in which the semiconductor chip is disposed, the terminal disposition portion projecting from the inner wall surface toward the open area and having a disposition surface thereof, the external connecting terminal penetrating through the frame portion from an outside of the case toward the inner space, a rear surface side of the external connecting terminal being embedded in the terminal disposition portion from the disposition surface thereof, the exposure region of the front surface of the external connecting terminal being exposed from the disposition surface of the terminal disposition portion; and a sealing member fixedly encapsulate the semiconductor chip in the open area, wherein the exposure region of the external connecting terminal has a pair of opposite sides parallel to each other in a direction from the inner wall surface toward the inner space, and at an area facing at least part of the opposite sides of the exposure region, the disposition surface is located between the front surface and the rear surface of the external connecting terminal in a thickness direction thereof, to have a level difference to the front surface of the external connecting terminal.

2. The semiconductor device according to claim 1, wherein a height of the level difference between the disposition surface and the front surface is equal to or greater than a quarter of a thickness of the external connecting terminal, from the front surface to the rear surface.

3. The semiconductor device according to claim 1, wherein the exposure region includes a bonding section to be electrically wire-bonded to the semiconductor chip, and the disposition surface has two lateral stepped sections that are respectively disposed at the opposite sides of the exposure region such that the lateral stepped sections sandwich the bonding section, and form the level difference.

4. The semiconductor device according to claim 1, wherein the exposure region of the external connecting terminal has a front side in a direction orthogonal to the opposite sides and being disposed between the opposite sides, and the level difference is formed between the front side of the exposure region and the disposition surface at an area facing to the front side of the exposure region.

5. The semiconductor device according to claim 1, wherein the exposure region of the external connecting terminal has a front side in a direction orthogonal to the opposite sides and being disposed between the opposite sides, and the level difference is formed
between the opposite sides of the exposure region and the disposition surface at an area facing to the opposite sides of the exposure region, and
between the front side of the exposure region and the disposition surface at an area facing to the front side of the exposure region.

6. The semiconductor device according to claim 1, wherein the external connecting terminal has a dull face on the rear surface.

7. The semiconductor device according to claim 1, wherein the external connecting terminal has a burr at the opposite sides of the front surface.

8. The semiconductor device according to claim 1, wherein the case is made of a material selected from the group consisting of a poly phenylene sulfide (PPS) resin, a polybutylene terephthalate (PBT) resin, and an epoxy-based resin.

9. The semiconductor device according to claim 1, wherein the sealing member is made of an epoxy-based resin.

10. The semiconductor device according to claim 9, wherein the sealing member includes an inorganic filler.

* * * * *